United States Patent
Rehwald et al.

(10) Patent No.: US 6,683,454 B2
(45) Date of Patent: Jan. 27, 2004

(54) SHIFTING OF ARTIFACTS BY REORDERING OF K-SPACE

(75) Inventors: Wolfgang G. Rehwald, Baltimore, MD (US); Jason A. Polzin, Lake Mills, WI (US); Thomas K. F. Foo, Rockville, MD (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/063,177

(22) Filed: Mar. 28, 2002

(65) Prior Publication Data

US 2003/0184291 A1 Oct. 2, 2003

(51) Int. Cl.$^7$ ................................................ G01V 3/00
(52) U.S. Cl. ...................................................... 324/307
(58) Field of Search ................................. 324/307, 309

(56) References Cited

U.S. PATENT DOCUMENTS

| | | | | |
|---|---|---|---|---|
| 4,710,717 A | * | 12/1987 | Pelc et al. | 324/309 |
| 4,748,410 A | * | 5/1988 | Macovski | 324/310 |
| 5,243,284 A | * | 9/1993 | Noll | 324/309 |
| 5,435,303 A | * | 7/1995 | Bernstein et al. | 600/413 |
| 5,545,992 A | * | 8/1996 | Foo | 324/309 |
| 5,653,233 A | * | 8/1997 | Pelc et al. | 600/410 |
| 5,713,358 A | * | 2/1998 | Mistretta et al. | 600/420 |
| 5,830,143 A | * | 11/1998 | Mistretta et al. | 600/420 |
| 5,910,728 A | * | 6/1999 | Sodickson | 324/309 |
| 5,997,883 A | * | 12/1999 | Epstein et al. | 324/306 |
| 6,073,041 A | * | 6/2000 | Hu et al. | 600/410 |
| 6,144,200 A | * | 11/2000 | Epstein et al. | 324/306 |
| 6,148,229 A | | 11/2000 | Morris, Sr. et al. | 600/509 |
| 6,201,393 B1 | | 3/2001 | Bernstein et al. | 324/309 |
| 6,268,730 B1 | * | 7/2001 | Du | 324/309 |
| 6,288,544 B1 | | 9/2001 | Bernstein et al. | 324/309 |
| 6,307,369 B1 | * | 10/2001 | Felmlee et al. | 324/309 |
| 6,329,819 B1 | | 12/2001 | Muanduca et al. | 324/309 |
| 6,353,752 B1 | * | 3/2002 | Madore et al. | 600/410 |
| 6,393,313 B1 | * | 5/2002 | Foo | 600/410 |
| 6,512,372 B1 | * | 1/2003 | Ikezaki | 324/312 |

FOREIGN PATENT DOCUMENTS

| | | |
|---|---|---|
| WO | WO97/17673 | 5/1997 |
| WO | WO 00/06245 | 10/2000 |

OTHER PUBLICATIONS

Wolfgang Rehwald, Jason Polzin, Glenn Slavin, Dan Rettmann, & Thomas Foo; "Effect of Sampling Order and Interpolation Method on Fast Cardiac Acquisition Schemes;" ISMRM Abstract for GE Medical Systems; Dec. 10, 2001.

Wolfgang Rehwald, Raymond Kim, Orlando Simonetti, Gerhard Laub, and Robert Judd; "Theory of High–Speed MR Imaging of the Human Heart with the Selective Line Acquisition Mode;" Radiology vol. 220 No. 2; Aug. 2001; pp. 540–547.

Jefrfrey Feinstein, Frederick Epstein, Andrew Arai, Thomas Foo, Michael Hartley, Robert Balaban, & Steven Wolff; "Using Cardiac Phase to Order Reconstruction (CAPTOR): A Method to Improve Diastolic Images;" JMRI vol. 7, No. 5; Sep./Oct. 1997; pp. 794–798.

* cited by examiner

*Primary Examiner*—Diego Gutierrez
*Assistant Examiner*—Dixomara Vargas
(74) *Attorney, Agent, or Firm*—Cantor Colburn LLP

(57) ABSTRACT

A system and method for shifting of motion based artifacts in images produced with an magnetic resonance imaging system configured to: select a segment of a plurality of segments comprising a selected number of k-space lines of k-space data for a temporal series and select a time interval from a plurality of time intervals for acquisition. The magnetic resonance imaging system is also configured to acquire N sets of k-space lines comprising every Nth k-space line of the segment for successive 1/N portions of said time interval and repeating the acquiring for successive sets of the N sets of k-space lines and wherein N is an integer greater than one. The acquisition is repeated for each time interval of the plurality of time intervals and for each segment of the plurality of segments. The k-spaced data are reconstructed employing a time-weighted average based on respective time of acquisition of the k-space lines.

33 Claims, 4 Drawing Sheets

SHIFTING OF ARTIFACTS BY REORDERING OF K-SPACE

BACKGROUND OF THE INVENTION

The field of the invention is nuclear magnetic resonance imaging methods and systems. More particularly, the invention relates to a method for shifting motion-based artifacts from the primary region of interest in the central field of view within an image field of view (FOV) to the side parts of the FOV by manipulating the order of a segmented k-space acquisition. It will be described with particular reference thereto. It will be appreciated, however, that the invention is also amenable to other like applications.

Magnetic resonance imaging is a diagnostic imaging modality that does not rely on ionizing radiation. Instead, it uses strong (ideally) static magnetic fields, radio-frequency (RF) pulses of energy and magnetic field gradient waveforms. More specifically, MR imaging is a non-invasive procedure that uses nuclear magnetization and radio waves for producing internal pictures of a subject. Three-dimensional diagnostic image data is acquired for respective "slices" of an area of the subject under investigation. These slices of data typically provide structural detail having a resolution of one (1) millimeter or better.

The data for each slice is acquired during respective excitations of the MR device. Ideally, there is little or no variation in the phase of the nuclear magnetization during the respective excitations. However, movement of the subject (caused, for example, by breathing, cardiac pulsation, blood pulsation, and/or voluntary movement) and/or fluctuations of the main magnetic field strength may change the nuclear magnetization phase from one excitation to the next. This change in the phase of the nuclear magnetization may degrade the quality of the MR data used to produce the images.

When utilizing MRI to produce images, a technique is employed to obtain MRI signals from specific locations in the subject. Typically, the region that is to be imaged (region of interest) is scanned by a sequence of MRI measurement cycles, which vary according to the particular localization method being used. The resulting set of received NMR signals are digitized and processed to reconstruct the image using one of many well-known reconstruction techniques. To perform such a scan, it is, of course, necessary to discriminate NMR signals from specific locations in the subject. This is accomplished by employing gradient magnetic fields denoted $G_x$, $G_y$, and $G_z$. These gradient magnetic fields are static magnetic fields along the x, y, and z axes exhibiting a gradient along the respective x, y and z axis. By controlling the strength of these gradients during each NMR cycle, the spatial distribution of spin excitation can be altered and the location is encoded in the resulting NMR signals.

Typically, the region to be imaged is scanned by a sequence of measurement cycles in which these gradients vary according to the particular localization method being used. The resulting set of received NMR signals are digitized and processed to reconstruct the image using one of many well-known reconstruction techniques.

Most NMR scans currently used to produce medical images require many minutes to acquire the necessary data. The reduction of this scan time is an important consideration, since reduced scan time increases patient throughput, improves patient comfort, and improves image quality by reducing motion artifacts. There is a class of pulse sequences, which have a very short repetition time (TR) and result in complete scans, which can be conducted in seconds rather than minutes. For example, when applied to cardiac imaging, a complete scan of a series of images showing the heart at different phases of its cycle or at different slice locations can be acquired in a single breath-hold.

There are two common techniques for acquiring cardiac MR images. The first is a prospectively gated, single-phase, multi-slice conventional spin echo sequence. In each cardiac cycle, data at different spatial locations are acquired with the same k-space phase encoding value. Images at the different spatial locations are then acquired at different temporal phase of the cardiac cycle.

In gated spin echo, data for each slice location is acquired at a fixed delay from the cardiac R-wave. With variations in the cardiac rhythm, the heart may be at a different phase of the cardiac cycle when data is acquired even though the cardiac delay time is the same. Normal variations of the cardiac cycle usually result in disproportionately larger changes in the diastolic portion of the cardiac cycle, and gated spin echo images acquired at the end of the cardiac cycle often exhibit blurring or ghosting artifacts.

Another disadvantage of gated spin echo is that images at different slice locations are acquired at different cardiac phases. Hence, it may be difficult to relate information from one spatial location to the next as the heart is pictured at different phases of the cardiac cycle. Furthermore, small structures may also be missed due to inadequate temporal and spatial coverage. Motion of the heart during the cardiac cycle can also lead to image contrast variations from slice to slice due to differential saturation or inter-slice cross talk.

A short TR gated gradient echo pulse sequence may be used to acquire (cine) images at multiple time frames of the cardiac cycle. As described in U.S. Pat. No. 4,710,717, conventional cine pulse sequences run asynchronously to the cardiac cycle with the phase encoding value stepped to a new value at each R-wave trigger. In CINE, each RF excitation pulse is applied at the same spatial location and repeated at intervals of TR in the cardiac cycle. Since the sequence runs asynchronously, the RF excitation pulses may occur at varying time delays from the R-wave from one cardiac cycle to the next. On detection of the next cardiac R-wave, the acquired data from the previous R—R interval are resorted and interpolated into evenly distributed time frames within the cardiac cycle. This method of gating is also known as retrospective gating as the data for the previous R—R interval is resorted only after the current R-wave trigger is detected.

The cardiac cycle is divided into equal time points or frames at which images of the heart are to be reconstructed. In order to reconstruct images at each of these time points, data acquired asynchronously is linearly interpolated to the pre-determined time points in the cardiac cycle. In order to account for variations in the cardiac R—R interval during the scan (from changing heart rate), the interpolation varies from cardiac cycle to cardiac cycle, depending on the R—R interval time. This method allows reconstruction of images at any phase of the cardiac cycle, independent of variations in heart rate. As in gated spin echo, only one k-space phase encoding view is acquired per heartbeat. The total image acquisition time is then on the order of 128 heart beats.

Faster scan times can be achieved by segmenting k-space and acquiring multiple phase encoding k-space views per R—R interval. The scan time is accelerated by a factor equal to that of the number of k-space views acquired per image per R—R interval. In this manner, a typical cine (e.g. movie or temporal series of images) acquisition with a matrix size of 128 pixels in the phase encoding direction can be completed in as little as 16 heart beats, when 8 k-space views per segment are acquired.

Multiple phases of the cardiac cycle can be visualized by repeated acquisition of the same k-space segment within each R—R interval but assigning the data acquired at different time points in the cardiac cycle to different cardiac phases. Thus, the cardiac cycle is sampled with a temporal resolution equal to the time needed to acquire data for a single segment, such that the temporal resolution equals the views per second, vps multiplied by the TR, where vps is the number of k-space lines per segment, the TR is the pulse sequence repetition time. The total scan time is then given as: the quantity $y_{res}$ divided by vps, times the R—R interval time, where $y_{res}$ is the number of phase encoding views in the image. Typically, an image utilizes 128 or more phase encoding views, and 8 views per segment is also often used.

In segmented k-space scans, the total scan time can be substantially reduced by increasing the number of views per segment (vps). However, this is at the expense of reducing the image temporal resolution. As described in U.S. Pat. No. 5,377,680, the image temporal resolution can be increased by sharing views between adjacent time segments to generate images averaged over different time points. The true image temporal resolution is unchanged but the effective temporal resolution is now doubled. View sharing can thus increase the number of cardiac phase images reconstructed without affecting the manner in which the k-space data is acquired.

Prospectively gated, segmented k-space sequences have become popular for cardiac imaging mainly because images can be obtained in a breath-hold and therefore do not suffer from respiratory artifacts. Images are formed by acquiring data over a series of heartbeats with data acquisition gated to the QRS complex of the ECG. For images to be acquired properly, using current methods, the duration of image acquisition must be less than or equal to the duration of the shortest expected R—R interval. In practice, this usually means that the last 10–20% of diastole (.about. 100–200 msec for a heart rate of 60 bpm) is not acquired.

Another problem with many current cardiac-gated sequences is that they sort data based on the time elapsed since the QRS complex. As described in U.S. Pat. No. 4,710,787, this strategy assumes that cardiac phase is directly proportional to time. However, in practice the relationship between cardiac phase and the time elapsed since the QRS is not strictly linear. For example, consider sinus arrhythmia where there is a normal, physiologic change in heart rate that accompanies respiration. The time between the QRS complex and end-diastole is longer for those heart beats with longer R—R intervals and in this case, end-diastole is better defined relative to the following (rather than the preceding) QRS complex. This can be seen readily in the normal ECG where the P wave (which signifies atrial contraction) is better correlated temporally to the following (rather than the preceding) QRS complex. This variation in the R—R interval and the fact that a specific cardiac phase occurs at a different delay time from the R-wave with this variation, leads to image blurring in fast segmented k-space pulse sequences and also in conventional cine pulse sequences.

Another method for prospectively gating and retrospectively sorting MR imaging data acquired during successive cardiac cycles was disclosed in U.S. Pat. No. 5,997,883. In this patent, a cardiac gating signal is produced and time-stamped MR data is continuously acquired during successive cardiac cycles to reduce image blurring in fast segmented k-space and cine acquisitions and more efficiently acquire MR data. A cardiac cycle systolic period and a cardiac cycle diastolic period are determined for each cardiac cycle and the time stamp associated with the acquired MR data is correlated with a systolic cardiac phase or a diastolic cardiac phase. Images are reconstructed at specified cardiac phases using MR image data which is acquired during successive cardiac cycles and which is selected on the basis of its correlated cardiac phase.

When acquiring a multiple images over time (e.g., a temporal series or movie), particularly of a patient's beating heart, motion paired with finite data acquisition duration limits the temporal resolution and leads to specific motion-related artifacts. For some sequences, these artifacts occur mainly in the center-half of the field of view (FOV), overlapping the object of interest, e.g., the heart. Because the center of the FOV is primarily the focus of the imaging, clinical image analysis may be impaired by artifacts such as motion-induced artifacts. These artifacts are generally caused by blood flow or simply cardiac motion with successive beats.

SUMMARY OF THE INVENTION

The above discussed and other drawbacks and deficiencies are overcome or alleviated by a system and method for shifting of motion based artifacts in images produced with an magnetic resonance imaging system, comprising: a magnetic resonance imaging system configured to: select a segment of a plurality of segments comprising a selected number of k-space lines of k-space data for a temporal series and select a time interval from a plurality of time intervals for acquisition. The magnetic resonance imaging system is also configured to acquire N sets of k-space lines comprising every Nth k-space line of the segment for successive 1/N portions of the time interval and repeating the acquisition for successive sets of the N sets of k-space lines and wherein N is an integer greater than one. The acquisition is repeated for each time interval of the plurality of time intervals and for each segment of the plurality of segments. The k-space data are reconstructed employing a time-weighted average based upon respective time of acquisition for the k-space lines from the k-space data acquired employing the magnetic resonance imaging system.

Also disclosed is a method of acquiring k-space data produced with an magnetic resonance imaging system, comprising: selecting a segment of a plurality of segments comprising a selected number of k-space lines of k-space data for a temporal series and selecting a time interval from a plurality of time intervals for acquisition. The method also includes: acquiring N sets of k-space lines comprising every Nth k-space line of the segment for successive 1/N portions of the time interval and repeating the acquisition for successive sets of the N sets of k-space lines and wherein N is an integer greater than one. The method further includes repeating the acquiring for each time interval of the plurality of time intervals and for each segment of the plurality of segments. The k-space data are reconstructed employing a time-weighted average based upon respective time of the acquiring of k-space lines from the k-space data acquired employing the magnetic resonance imaging system.

Also disclosed is a storage medium encoded with a machine-readable computer program code including: instructions for causing a computer to implement the above-mentioned method for shifting of motion based artifacts in images produced with an magnetic resonance imaging system.

Further disclosed is a computer data signal comprising code configured to cause a processor to implement the above mentioned method for shifting of motion based artifacts in images produced with an magnetic resonance imaging system.

The above discussed and other features and advantages of the present invention will be appreciated and understood by those skilled in the art from the following detailed description and drawings.

BRIEF DESCRIPTION OF THE DRAWINGS

Referring to the exemplary drawings wherein like elements are numbered alike in the several Figures.

DETAILED DESCRIPTION

Figure 1:
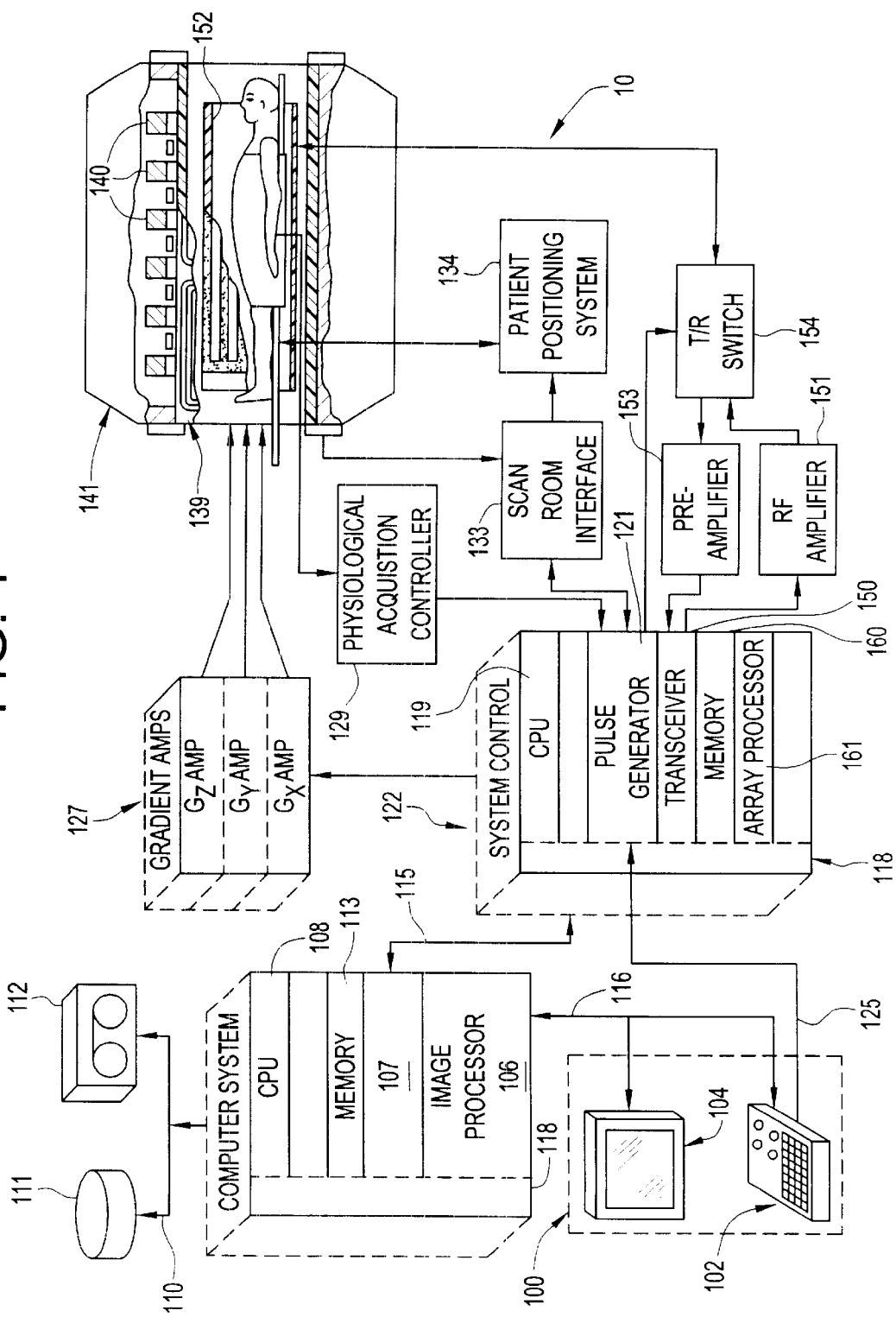
FIG. 1 is a block diagram of an MRI system that employs the present invention.

Referring first to FIG. 1, there is shown the major components of a preferred MRI system 10, which incorporates the present invention. The operation of the system is controlled from an operator console 100, which includes a keyboard and control panel 102 and a display 104. The console 100 communicates through a link 116 with a separate computer system 107 that enables an operator to control the production and display of images on the display 104. The computer system 107 includes a number of modules, which communicate with each other through a backplane 118. These include an image processor module 106, a CPU module 108 and a memory module 113, known in the art as a frame buffer for storing image data arrays. The computer system 107 is linked to storage media 111, and 112 such as disk storage, tape drive, and the like, for storage of image data and programs, and it communicates with a separate system control 122 through a high speed serial link 115.

The system control 122 includes a set of modules connected together by a backplane 118. These include a CPU module 119 and a pulse generator module 121, which connects to the operator console 100 through a serial link 125. It is through this link 125 that the system control 122 receives commands from the operator, which indicate the scan sequence that is to be performed. The pulse generator module 121 operates the system components to carry out the desired scan sequence. It produces data, which indicates the timing, strength and shape of the RF pulses, which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133, which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system comprised of $G_x$, $G_y$, and $G_z$ amplifiers 127. Each gradient amplifier 127 excites a corresponding gradient coil in an assembly generally designated 139 to produce the magnetic field gradients used for position encoding acquired signals. The gradient coil assembly 139 forms part of a magnet assembly 141, which includes a polarizing magnet 140 and a whole-body RF coil 152. A transceiver module 150 in the system control 122 produces pulses, which are amplified by an RF power amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either a transmit or receive mode.

The NMR signals picked up by the RF coil 152 are digitized by the transceiver module 150 and transferred to a memory module 160 in the system control 122. When the scan is completed and an entire array of raw k-space data has been acquired in the memory module 160. As will be described in more detail below, this raw k-space data is rearranged into separate k-space data arrays for each cardiac phase image to be reconstructed, and each of these is input to an array processor 161 operates to Fourier transform the data into an array of image data. This image data is conveyed through the serial link 115 to the computer system 107 where it is stored in the storage medium 111, e.g., disk memory, tape, and the like. In response to commands received from the operator console 100, this image data may be archived on the storage medium 112 e.g., tape drive, disk memory, and the like, or it may be further processed by the image processor 106 and conveyed to the operator console 100 and presented on the display 104.

Referring still to FIG. 1 the NMR signal produced by the subject is picked up by the receiver coil e.g., RF coil 152 and applied through the preamplifier 153 to the input of a transceiver 150. The received signal is at or around the Larmor frequency, and this high frequency signal is down converted in a two-step process, which first mixes the NMR signal with a carrier signal and then mixes the resulting difference signal with a reference signal. The down converted NMR signal is applied to the input of an analog-to-digital (A/D) converter, which samples and digitizes the analog signal and applies it to a digital detector and signal processor which produces in-phase (I) values and quadrature (Q) values corresponding to the received NMR signal. The resulting stream of digitized I and Q values of the received signal are output through backplane 118 to the memory module 160 and array processor 161 where they are employed to reconstruct an image.

Figure 2:
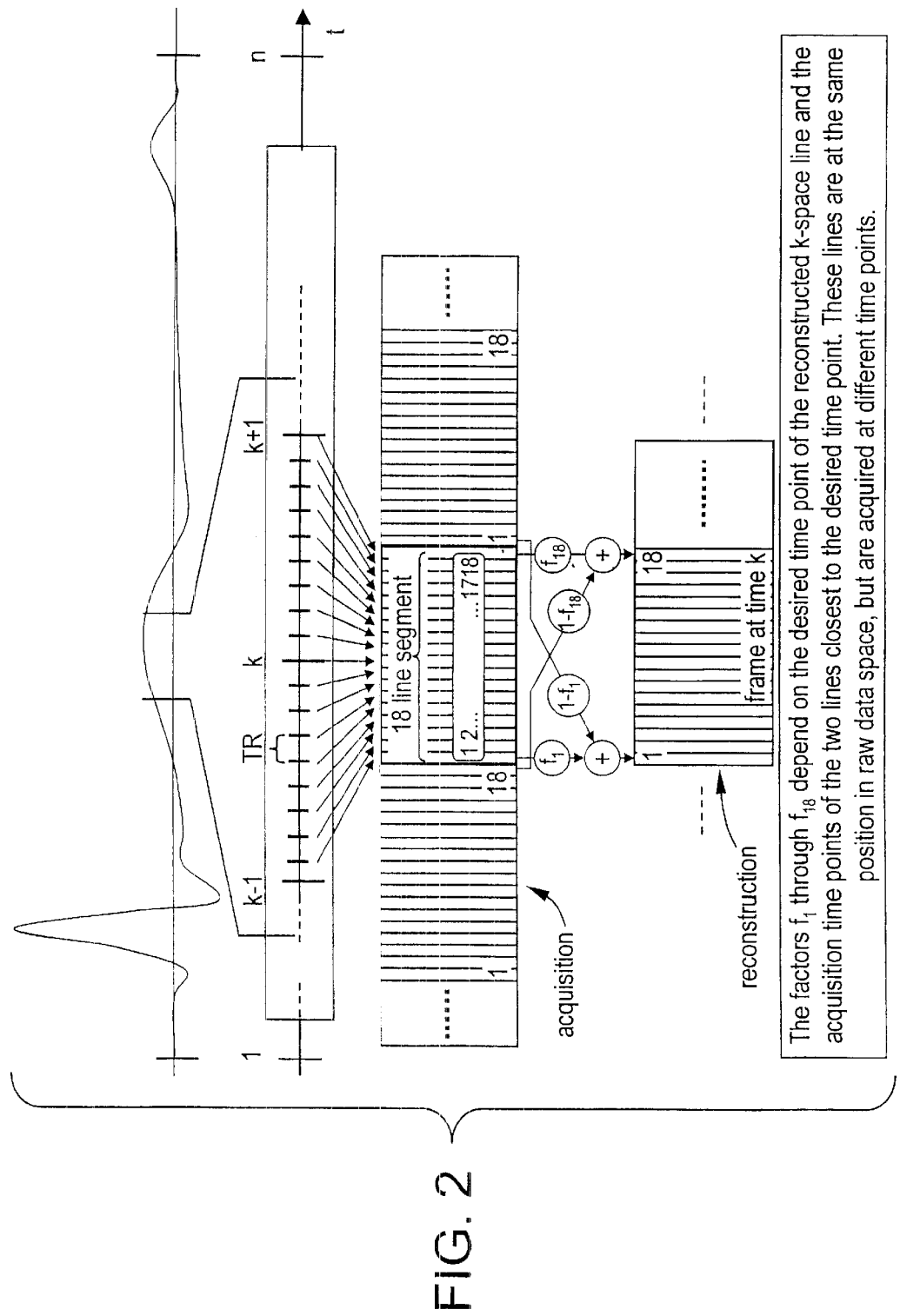
FIG. 2 is a graphic representation of a conventional fast gradient echo CINE successive image acquisition and reconstruction.

Referring now to FIG. 2, the cardiac acquisition in accordance with the preferred embodiment employs a series of fast gradient echo pulse sequences, with the repetition time, TR, of each gradient echo pulse sequence of between about 6 and about 15 ms, depending on the type of gradient hardware available and imaging parameters chosen. These pulse sequences are executed during the interval between the cardiac trigger signals (or any equivalent initiation point) 502 referred to as the R—R interval for the patients electrocardiogram. The length of the R—R interval is a function of the patient's heart rate.

In a fast cardiac acquisition using gradient echoes, the R—R interval is divided up into many short acquisitions, with each acquisition being a fast gradient acquisition pulse sequence with a nominal flip angle of between about 20–30 degrees. When the fast gradient echo pulse sequence is repeatedly employed to perform successive scans and to generate multiple images, two-dimensional arrays of k-space data are acquired. For example, x NMR echo signals are acquired, each with a different phase encoding and y samples are acquired from each NMR echo signal to produce a x by y element k-space data set.

Each fast gradient echo acquisition acquires an NMR signal representing a single line or view of k-space, which is referred to herein as a line. Adjacent fast gradient echo acquisitions may be further combined into segments 512 where the data from each segment 512 includes a plurality of different lines. In the preferred embodiment, each segment 512 contains 18 lines and k-space is traversed in a sequential strip fashion during the scan. However, depending on the particular application, any other appropriate view acquisition order can also be used. An exemplary method for sequential imaging is disclosed U.S. Pat. No. 5,997,883. This patent discloses an imaging sequence employing a cardiac gating signal to produce and time-stamp MR data continuously acquired during successive cardiac cycles to reduce image blurring in fast segmented k-space and cine acquisitions and more efficiently acquire MR data. An exemplary embodiment is described herein and illustrated with reference to the fast gradient echo imaging sequence disclosed in U.S. Pat. No. 5,997,883. It should be appreciated that while an exemplary embodiment is described with reference to a fast gradient echo sequence, the particular imaging sequence whether fast gradient echo or spin echo and the like is not limiting. The invention as disclosed is equally applicable to the capture of NMR data for any temporal series of images.

Referring to FIG. 2, a conventional cine MRI acquisition of a segmented k-space is depicted for a single R—R interval 500 of a temporal series, for example a heartbeat, or series or heartbeats. The figure depicts the time history of one R—R interval 500 and the sequential (SE) acquisition of the $k_i$ segment 512 of an n segment series of images 510 for selected time intervals 504 (e.g., a cardiac phase) over the time history. In an illustrative sequence, each of the k-space lines denoted generally as 514 that comprise the $k_i$ segment 512 are acquired in series in sequence for example, first, second, third and so on. Reconstruction and interpolation for another time interval $k_j$ in the temporal series or time history is based upon a time weighted average for each respective line 514 of the $k_j$ segment as a function of the two segments closest to the selected segment. In this manner, an image may be interpolated for any time in total duration for which image data are taken.

Figure 3:
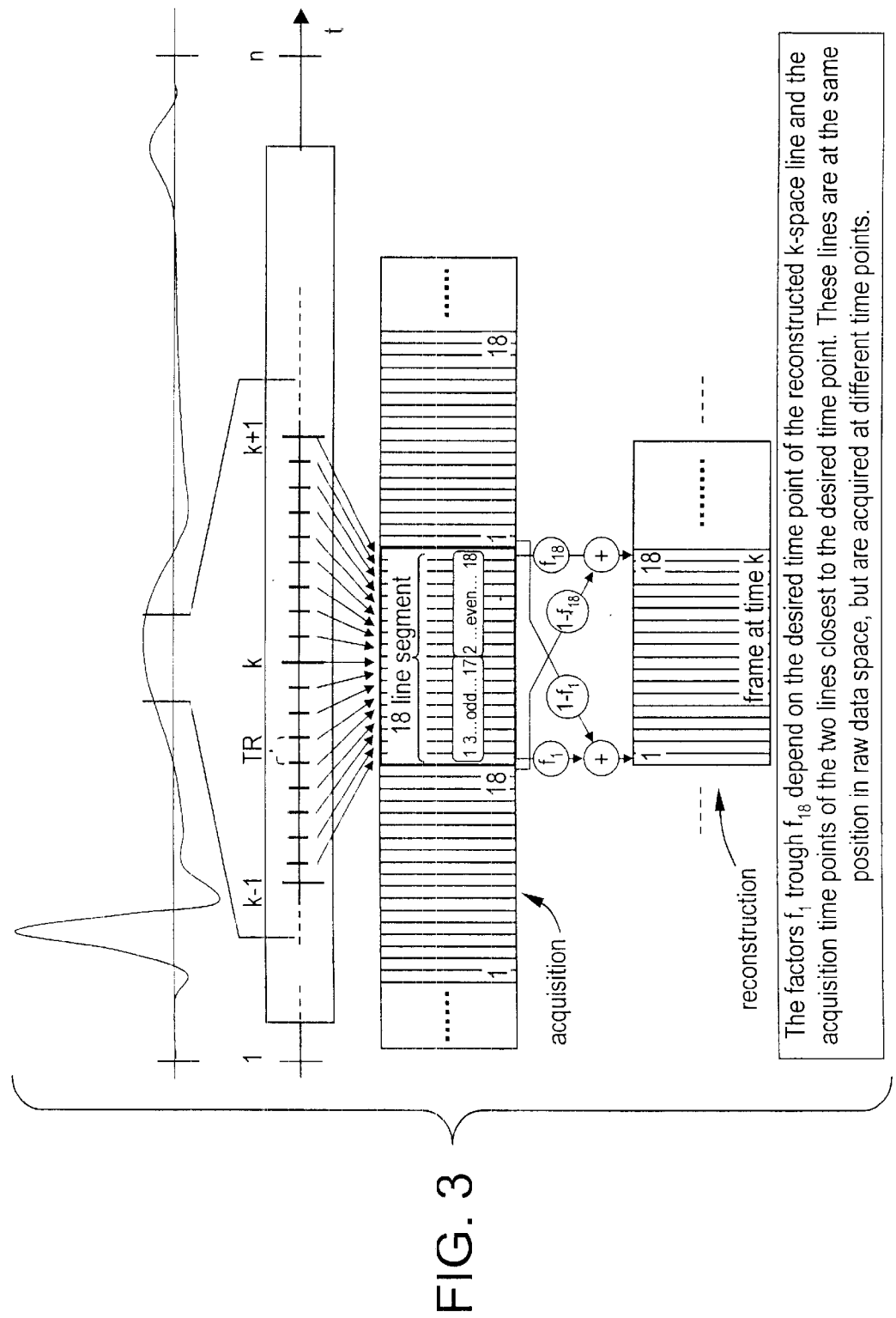
FIG. 3 is a graphic representation of a successive image acquisition and reconstruction employing an exemplary embodiment.

An exemplary embodiment is practiced by changing the order of acquisition of a segmented k-space data set on a line-by-line basis for a selected image or image set and then reconstructing an image(s) from the data set. Referring to FIG. 3, a MRI acquisition of a k-space segment is once again depicted for a single R—R interval 500 of a temporal series. Once again, the figure depicts the time history of one R—R interval 500 and the acquisition of the $k_i$ segment 512 of an n segment series of images 510 over time. However, in this instance of an illustrative sequence of an exemplary embodiment, the k-space lines 514 that comprise the $k_j$ segment 512 are acquired in a selected sequence. More specifically, in this instance, an odd/even sequence, such that each of the odd lines 514, e.g., first, third and so on, in succession, of the data space are acquired during the first half of the segment 512, followed by each of the even lines 514 in succession during the second half of the segment 512 (OE). It will be appreciated that while an odd/even sequence is disclosed, other alternatives have been contemplated and are within the scope of the claims.

Once again reconstruction and interpolation for another time window $k_j$ 504 e.g., cardiac phase in the R—R interval 500 of the temporal series is based upon a time weighted average for each respective line of the $k_j$ segment as a function of the two segments closest ($k_{j-1}$ and $k_{j+1}$) to the selected segment. In this manner, a k-space, (and thereafter an image) may be interpolated for any time in total duration for which image data are captured. It is noteworthy to appreciate that the reconstruction as identified here is identical to that employed for conventional cine acquisition, except that the reconstruction now includes addressing the line sequence. In other words, in conventional acquisition, the line sequence was always 1–18, where as here it is 1, 3, 5 . . . 14, 16, 18. It should be appreciated that while in an exemplary embodiment an odd then even sequence is described, an even odd sequence is equally applicable. Moreover, other sequences involving different arrangements may be employed. For example, a thirds sequence where every third line is acquired in succession; such as 1, 4, 7, 10, 13, 16; 2, 5, 8, 11, 14, 17; and 3, 6, 9, 12, 15, 18. As is now evident the sequencing could be divided for arbitrary number of N divisions.

Figure 4:
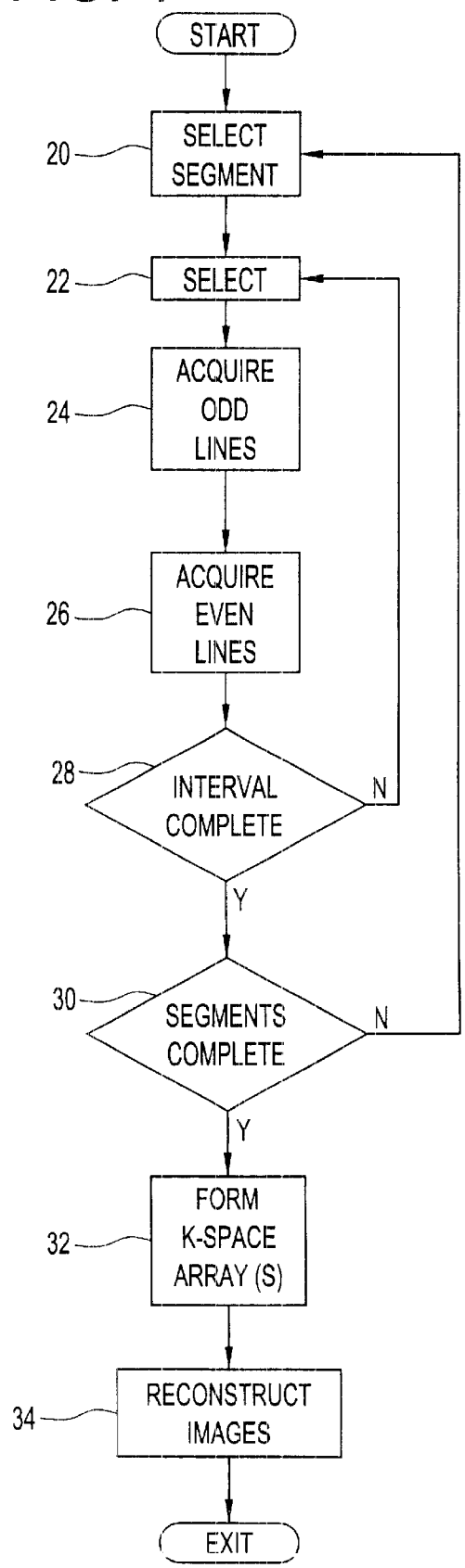
FIG. 4 is a flowchart depicting the method of acquisition for an exemplary embodiment.

The method of the present invention is implemented in the MRI system of FIG. 1 under the direction of a program indicated by the flow chart in FIG. 4. A scan is initiated, in an iterative process as indicated at process block 20 with the segment 512 selection. The process continues to process block 22 for the selection of the cardiac phase e.g., as indicated at 504. The acquisition proceeds at process block 24 by acquiring the odd lines or views for the raw k-space of a selected segment (e.g., the $k_i$ as depicted in FIG. 3). Thereafter, at process block 26, the even lines or views for the k-space of a selected segment are acquired. Decision block 28 evaluates whether the desired R—R interval has been covered. The process is repeated until the lines for the selected segment for each k-space of each cardiac phase 504 of the R—R interval is acquired (e.g for $k_1$ to $k_n$). In other words, the odd/even acquisition process is repeated for each segment throughout each cardiac phase 504 of a complete cardiac cycle so that the raw k-space data for the lines in a selected segment are acquired throughout the cardiac cycle. The acquired data is stored such that it is effectively time stamped. In an exemplary embodiment, the acquired data is stored separately for each heartbeat (cardiac cycle) in the order in which it is acquired. Therefore, the time during the cardiac cycle at which a view is acquired is indicated by its location in the raw data array and this time may be calculated by multiplying the pulse sequence repetition time (TR) by the number of views acquired since the last trigger signal 502. Similarly, the duration of each corresponding R—R interval during the scan is also recorded. It is noteworthy to appreciate that storing the raw NMR data in succession as disclosed above is but one method of time correlation for the data and should not be considered limiting. Numerous methods of time stamping or time correlating are possible and would be applicable without limitation.

Returning to FIG. 4, decision block 30 evaluates whether raw data has been acquired for the each segment 512. The process is repeated successively for each segment to further acquire raw data for each cardiac phase. For example, the process is repeated in a later cardiac cycle, for subsequent segments, comprising lines 19–36, for example, once again with odd lines acquired first and even thereafter. Thereby, proceeding to fill out the array of raw data for each cardiac phase of the current R—R interval.

Once the raw k-space data has been acquired for each cardiac phase 504 for each of the segments, 512 reconstruction of the k-space data from the raw data is initiated at 32. As indicated at process block 32, a complete k-space data array is then formed by selecting the appropriate k-space lines from the raw data array and applying the appropriate weighting. After the k-space data array has been formed, a cardiac phase image is reconstructed as indicated at process block 34. Image reconstruction is typically performed by a two-dimensional fast Fourier transformation along the two axes of this data set and the magnitude of the signal at each image pixel location is then calculated.

Upon image generation, employing the abovementioned acquisition methods, artifacts, which would have appeared in the center of the field of view, are shifted to the outside of the field of view. Where the artifacts are shifted is dependent upon the sequencing used. For example, for OE sequencing (N=2) the artifacts present in the center field of view are shifted to the outer quarters of the field of view.

The system and methodology described in the numerous embodiments hereinbefore provides a design and method to enhance detail in the area of interest near the center of the FOV by shifting motion based artifacts in an MRI from the center of the FOV to the outer edges. In addition, the disclosed invention may be embodied in the form of computer-implemented processes and apparatuses for practicing those processes. The present invention can also be embodied in the form of computer program code containing instructions embodied in tangible media, such as floppy diskettes, CD-ROMs, hard drives, or any other computer-readable storage medium such as 111 and 112, wherein, when the computer program code is loaded into and executed by a computer, the computer becomes an apparatus for practicing the invention. The present invention can also be embodied in the form of computer program code, for example, whether stored in a storage medium 111, 112, loaded into and/or executed by a computer, or as data signal 110 transmitted whether a modulated carrier wave or not, over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A method of shifting of motion based artifacts in images produced with a magnetic resonance imaging system, comprising:

selecting a segment of a plurality of segments comprising a selected number of k-space lines of k-space data for a temporal series;

selecting a time interval from a plurality of time intervals for acquisition;

acquiring N sets of k-space lines comprising every Nth k-space line of said segment for successive 1/N portions of said time interval and repeating said acquiring for successive sets of said N sets of k-space lines and wherein N is an integer greater than one;

repeating said acquiring for each time interval of said plurality of time intervals and for each segment of said plurality of segments; and wherein said k-space data are reconstructed employing a time weighted average based upon respective time of said acquiring k-space lines from said k-space data acquired employing said magnetic resonance imaging system.

2. The method of claim 1 wherein N=2, comprising odd/even acquisition.

3. The method of claim 2 wherein even k-space lines are acquired after odd k-space lines.

4. The method of claim 1 wherein said acquiring is conducted in a selected order.

5. The method of claim 1 wherein said segment comprises 18 k-space lines.

6. The method of claim 1 wherein said time interval comprises a cardiac phase.

7. The method of claim 1 wherein said temporal series includes a plurality of cardiac cycles and said k-space data comprises a concatenated time history of data from one or more cardiac cycles of said plurality of cardiac cycles.

8. The method of claim 1 wherein said motion based artifacts are shifted from a center field of view position to an outer 1/(2 N) field of view position.

9. A method of acquiring k-space data produced with an magnetic resonance imaging system, comprising:

selecting a segment of a plurality of segments comprising a selected number of k-space lines of k-space data for a temporal series;

selecting a time interval from a plurality of time intervals for acquisition;

acquiring N sets of k-space lines comprising every Nth k-space line of said segment for successive 1/N portions of said time interval and repeating said acquiring for successive sets of said N sets of k-space lines and wherein N is an integer greater than one;

repeating said acquiring for each time interval of said plurality of time intervals and for each segment of said plurality of segments; and wherein said k-space data are reconstructed employing a time weighted average based upon respective time of said acquiring k-space lines from said k-space data acquired employing said magnetic resonance imaging system.

10. The method of claim 9 wherein N=2, comprising odd/even acquisition.

11. The method of claim 10 wherein even k-space lines are acquired after odd k-space lines.

12. The method of claim 9 wherein said acquiring is conducted in a selected order.

13. The method of claim 9 wherein said segment comprises 18 k-space lines.

14. The method of claim 9 wherein said time interval comprises a cardiac phase.

15. The method of claim 9 wherein said temporal series includes a plurality of cardiac cycles and said k-space data comprises a concatenated time history of data from one or more cardiac cycles of said plurality of cardiac cycles.

16. The method of claim 9 wherein said motion based artifacts are shifted from a center field of view position to an outer 1/(2 N) field of view position.

17. A system for shifting of motion based artifacts in images produced with an magnetic resonance imaging system, comprising:

a means for selecting a segment of a plurality of segments comprising a selected number of k-space lines of k-space data for a temporal series;

a means for selecting a time interval from a plurality of time intervals for acquisition;

a means for acquiring N sets of k-space lines comprising every Nth k-space line of said segment for successive 1/N portions of said time interval and repeating said acquiring for successive sets of said N sets of k-space lines and wherein N is an integer greater than one;

a means for repeating said acquiring for each time interval of said plurality of time intervals and for each segment of said plurality of segments; and wherein said k-spaced data are reconstructed employing a time weighted average based upon respective time of said acquiring k-space lines from said k-space data acquired employing said magnetic resonance imaging system.

18. The system of claim 17 wherein N=2, comprising odd/even acquisition.

19. The system of claim 18 wherein even k-space lines are acquired after odd k-space lines.

20. The system of claim 17 wherein said segment comprises 18 k-space lines.

21. The system of claim 17 wherein said time interval comprises a cardiac phase.

22. The system of claim 17 wherein said temporal series includes a plurality of cardiac cycles and said k-space data comprises a concatenated time history of data from one or more cardiac cycles of said plurality of cardiac cycles.

23. The system of claim 17 wherein said motion based artifacts are shifted from a center field of view position to an outer 1/(2 N) field of view position.

24. A system for shifting of motion based artifacts in images produced with an magnetic resonance imaging system, comprising:

a magnetic resonance imaging system configured including system control configured to:

select a segment of a plurality of segments comprising a selected number of k-space lines of k-space data for a temporal series;

select a time interval from a plurality of time intervals for acquisition;

acquire N sets of k-space lines comprising every Nth k-space line of said segment for successive 1/N portions of said time interval and repeating said acquiring for successive sets of said N sets of k-space lines and wherein N is an integer greater than one;

repeat said acquiring for each time interval of said plurality of time intervals and for each segment of said plurality of segments; and wherein said k-spaced data are reconstructed employing a time weighted average based upon respective time of said acquiring k-space lines from said k-space data acquired employing said magnetic resonance imaging system.

25. The system of claim 24 wherein N=2, comprising odd/even acquisition.

26. The system of claim 25 wherein even k-space lines are acquired after odd k-space lines.

27. The system of claim 24 wherein said acquiring is conducted in a selected order.

28. The system of claim 24 wherein said segment comprises 18 k-space lines.

29. The system of claim 24 wherein said time interval comprises a cardiac phase.

30. The system of claim 24 wherein said temporal series includes a plurality of cardiac cycles and said k-space data comprises a concatenated time history of data from one or more cardiac cycles of said plurality of cardiac cycles.

31. The system of claim 24 wherein said motion based artifacts are shifted from a center field of view position to an outer 1/(2N) field of view position.

32. A storage medium encoded with a machine-readable computer program code;

said code including instructions for causing a computer to implement a method for shifting of motion based artifacts in images produced with an magnetic resonance imaging system, the method comprising:

selecting a segment of a plurality of segments comprising a selected number of k-space lines of k-space data for a temporal series;

selecting a time interval from a plurality of time intervals for acquisition;

acquiring N sets of k-space lines comprising every Nth k-space line of said segment for successive 1/N portions of said time interval and repeating said acquiring for successive sets of said N sets of k-space lines and wherein N is an integer greater than one;

repeating said acquiring for each time interval of said plurality of time intervals and for each segment of said plurality of segments; and wherein said k-spaced data are reconstructed employing a time weighted average based upon respective time of said acquiring k-space lines from said k-space data acquired employing said magnetic resonance imaging system.

33. A computer data signal comprising code configured to cause a processor to implement a method for shifting of motion based artifacts in images produced with an magnetic resonance imaging system, the method comprising:

selecting a segment of a plurality of segments comprising a selected number of k-space lines of k-space data for a temporal series;

selecting a time interval from a plurality of time intervals for acquisition;

acquiring N sets of k-space lines comprising every Nth k-space line of said segment for successive 1/N portions of said time interval and repeating said acquiring for successive sets of said N sets of k-space lines and wherein N is an integer greater than one;

repeating said acquiring for each time interval of said plurality of time intervals and for each segment of said plurality of segments; and wherein said k-spaced data are reconstructed employing a time weighted average based upon respective lime of said acquiring k-space lines from said k-space data acquired employing said magnetic resonance imaging system.

* * * * *